US011418211B2

United States Patent
Liao

(10) Patent No.: US 11,418,211 B2
(45) Date of Patent: Aug. 16, 2022

(54) SIGMA-DELTA MODULATION DEVICE AND SIGMA-DELTA MODULATION METHOD

(71) Applicant: Realtek Semiconductor Corporation, Hsinchu (TW)

(72) Inventor: Chen-Fong Liao, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/199,906

(22) Filed: Mar. 12, 2021

(65) Prior Publication Data

US 2022/0052706 A1    Feb. 17, 2022

(30) Foreign Application Priority Data

Aug. 14, 2020    (TW) .................................. 109127817

(51) Int. Cl.
    *H03M 3/00*    (2006.01)
(52) U.S. Cl.
    CPC ........... *H03M 3/358* (2013.01); *H03M 3/392* (2013.01)
(58) Field of Classification Search
    CPC ............................. H03M 3/392; H03M 3/358
    USPC .................................................. 341/126–155
    See application file for complete search history.

(56) References Cited

U.S. PATENT DOCUMENTS

| 7,928,876 | B2 * | 4/2011 | Thomsen | H03M 3/484 |
| | | | | 375/247 |
| 9,748,929 | B1 * | 8/2017 | Lamb | H03M 3/50 |
| 9,768,800 | B1 * | 9/2017 | Nguyen | H03F 3/45273 |
| 2006/0097899 | A1 * | 5/2006 | Nagai | H03M 3/48 |
| | | | | 341/143 |
| 2022/0045702 | A1 * | 2/2022 | Solanki | H04B 1/04 |

FOREIGN PATENT DOCUMENTS

CN            1981445 A        6/2007

* cited by examiner

*Primary Examiner* — Lam T Mai
(74) *Attorney, Agent, or Firm* — Locke Lord LLP; Tim Tingkang Xia, Esq.

(57) ABSTRACT

A sigma-delta modulation device includes a detection circuit and a sigma-delta modulator. The detection circuit is configured to detect an input signal to generate a detection signal, and compare the detection signal and a threshold to generate a control signal. The sigma-delta modulator is coupled to the detection circuit and configured to store a plurality of noise transfer functions, select one of the noise transfer functions according to the control signal, and convert the input signal into an output signal according to the noise transfer function.

15 Claims, 4 Drawing Sheets

SIGMA-DELTA MODULATION DEVICE AND SIGMA-DELTA MODULATION METHOD

CROSS-REFERENCE TO RELATED APPLICATION

This application claims priority to Taiwan Application Serial Number 109127817, filed Aug. 14, 2020, which is herein incorporated by reference in its entirety.

BACKGROUND

Field of Invention

The present invention relates to a digital-to-analog converter (DAC) or an analog-to-digital converter (ADC). More specifically, the present invention relates to a sigma-delta modulation device and a sigma-delta modulation method.

Description of Related Art

Sigma-delta modulators are commonly used in DACs and ADCs, and the stability of such sigma-delta modulators is limited by some dimensions of the input signal (e.g. the amplitude of the signal). Input signal with large dimensions can damage stability of the modulator.

Therefore, it is important to provide a sigma-delta modulator with high input upper-bound and good dynamic range.

SUMMARY

This disclosure provides a sigma-delta modulation device, including a detection circuit and a sigma-delta modulator. The detection circuit is configured to detect an input signal to generate a detection signal, and compare the detection signal with a threshold to generate a control signal. The sigma-delta modulator is coupled to the detection circuit and configured to store a plurality of noise transfer functions, select one of the noise transfer functions according to the control signal, and convert the input signal into an output signal according to the selected noise transfer function.

This disclosure also provides a sigma-delta modulation method applicable to a sigma-delta modulation device. The sigma-delta modulation device includes a sigma-delta modulator. The sigma-delta modulator is configured to store a plurality of noise transfer functions. The sigma-delta modulation method includes: detecting an input signal of the sigma-delta modulator to generate a detection signal; comparing the detection signal with a threshold to generate a control signal; selecting one of the noise transfer functions according to the control signal; and converting the input signal to an output signal according to the selected noise transfer function.

In conclusion, by detecting the variation of the specific parameters of the input signal to generate the corresponding control signal to switch between different noise transfer functions, the sigma-delta modulator can maintain excellent dynamic range and stability.

It is to be understood that both the foregoing general description and the following detailed description are exemplary and explanatory only and are not restrictive of the invention, as claimed.

DETAILED DESCRIPTION

The following is a detailed description of the embodiments in conjunction with the drawings, but the specific embodiments described are only used to explain the disclosure, not to limit the disclosure, and the description of the structural operation is not used to limit the order of its implementation. Any recombined structure or device recombined from the components and having the equal performance is covered by the present disclosure.

Figure 1:
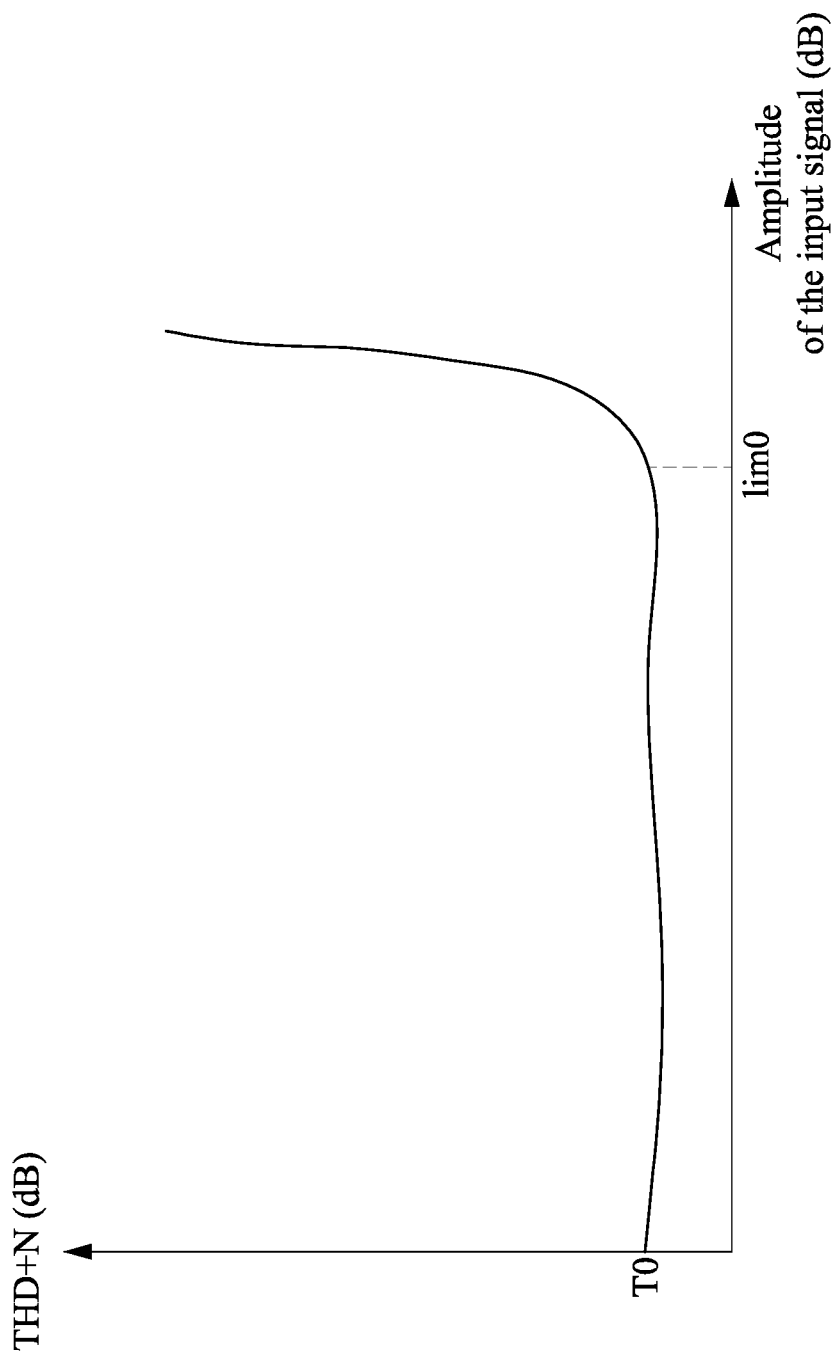
FIG. 1 is a schematic diagram showing the relationship between the total harmonic distortion plus noise (THD+N) of the sigma-delta modulator and the amplitude of the input signal.

Please refer to FIG. 1. FIG. 1 is the schematic diagram showing the relationship between a THD+N (Total Harmonic Distortion plus Noise) of the sigma-delta modulator and an amplitude of an input signal. As shown in FIG. 1, when the amplitude of the input signal (in dB) is not larger than a value lim0, a degree of variation in THD+N is relatively moderate; when the amplitude of the input signal is larger than the value lim0, the THD+N increases significantly. In other words, when the amplitude of the input signal received by the sigma-delta modulator is greater than the value lim0, the proportion of harmonics and noises in the output signal generated by the sigma-delta modulator increases greatly. That is, when the amplitude of the input signal exceeds a specific value, the output signal reflects large distortions with respect to the input signal.

An amplitude upper-bound of the input signal that the sigma-delta modulator can process stably and generate a relatively accurate output signal accordingly can be referred to as the input upper-bound (i.e., the value lim0). As shown in FIG. 1, when the amplitude of the input signal exceeds the input upper-bound lim0, the THD+N of the output signal increases significantly. That is, when the input signal is greater than the input upper-bound lim0, the substantial content of the output signal can be covered by the distortions and noise. Generally speaking, it is expected that an ideal sigma-delta modulator can provide a high input upper-bound.

When there is no input signal (i.e., when the amplitude of the input signal equals to zero), the intensity of the THD+N is referred to as a noise floor. As shown in t FIG. 1, the noise floor of the sigma-delta modulator is T0. The intensity difference between the maximum effective output (e.g., the output signal's maximum intensity that a sigma-delta modulator can reach and substantially undistorted) and the noise floor (e.g., T0) of the sigma-delta modulator is referred to as the dynamic range. A simple explanation is that the dynamic range can be understood as a difference between the minimum output intensity and the maximum output intensity of the sigma-delta modulator. Generally speaking, it is expected that an ideal sigma-delta modulator can provide a great dynamic range.

Figure 2:
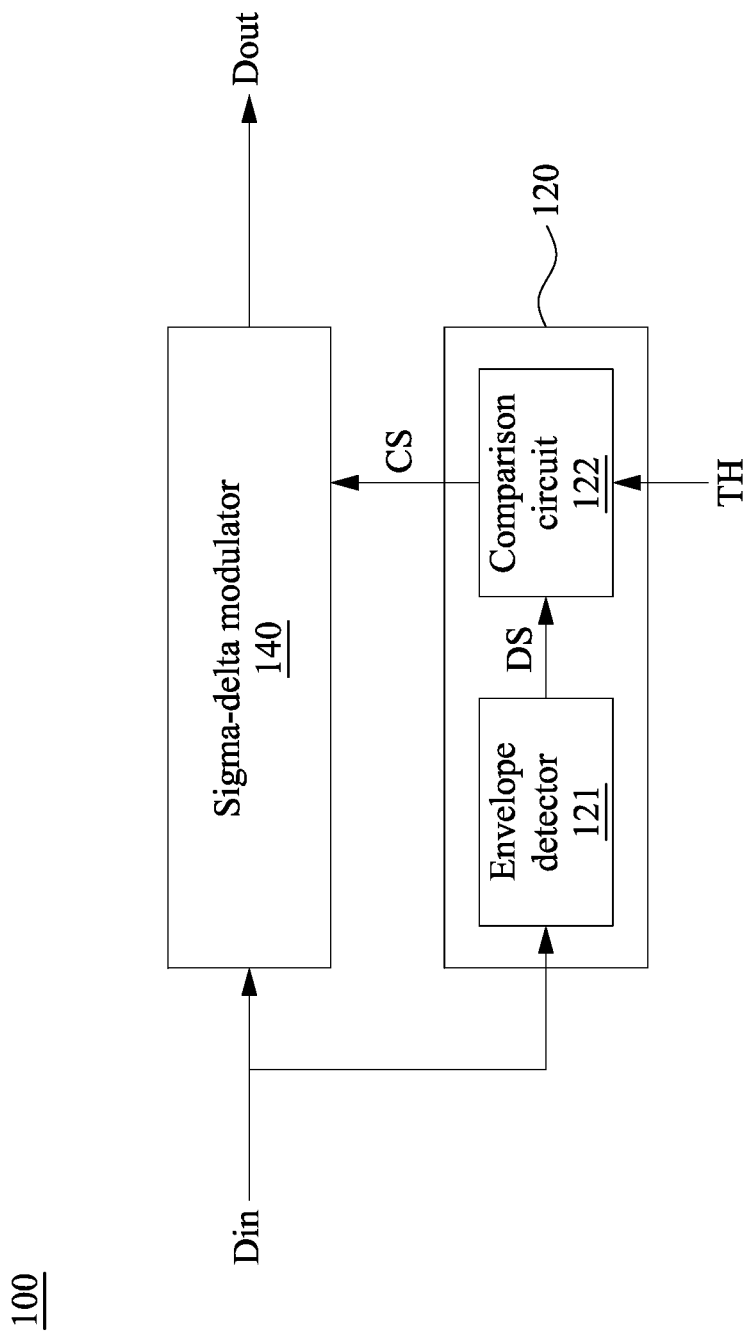
FIG. 2 is a schematic diagram of a sigma-delta modulation device according to some embodiments of this disclosure.

Reference is made to FIG. 2. FIG. 2 is the schematic diagram of a sigma-delta modulation device 100 according to one embodiment of this disclosure. The sigma-delta modulation device 100 can be adapted to DACs (Digital to Analog Converters) and ADCs (Analog to Digital Converters). As shown in FIG. 2, the sigma-delta modulation device 100 includes a detection circuit 120 and a sigma-delta modulator 140 and the sigma-delta modulator 140 is coupled to the detection circuit 120.

In some embodiments, the detection circuit 120 includes an envelope detector 121 and a comparison circuit 122. Specifically, the envelope detector 121 is coupled to the comparison circuit 122, and the comparison circuit 122 is coupled to the sigma-delta modulator 140. In a practical implementation, the comparison circuit 120 can be implemented by an operational amplifier or other voltage determination capable circuits. It is noted that the detection circuit 120 shown in FIG. 2 is exemplary and is not intended to limit the disclosure. Those having ordinary skills in the art can make proper modifications based on demands.

In one embodiment, the detection circuit 120 is configured to detect an input signal Din to generate a detection signal DS and to compare the detection signal DS with an amplitude threshold TH in order to generate a control signal CS. A sigma-delta modulator 140 is configured to store a plurality of noise transfer functions, to select one of the noise transfer functions according to the control signal CS, and to convert the input signal Din to an output signal Dout according to the selected noise transfer function. In the embodiment mentioned above, the detection circuit 120 compares the amplitude of the detection signal DS with the amplitude threshold TH to generate the control signal CS, but this disclosure is not limited to this embodiment. In another embodiment, the detection circuit 120 can compare other signal parameters (e.g., duration of signal pulse, a duty cycle, etc.) with the corresponding threshold to generate the control signal CS. For the sake of brevity, the following embodiments use the amplitude of detection signal DS and the amplitude threshold TH as examples to explain the disclosure.

Specifically, the envelope detector 121 of the detection circuit 120 is configured to receive the input signal Din, to detect the amplitude variation of the input signal Din to generate the detection signal DS, and to transmit the detection signal DS to the comparison circuit 122. The comparison circuit 122 of the detection circuit 120 is configured to receive the detection signal DS, to compare the detection signal DS and the amplitude threshold TH to generate the control signal CS, and to transmit the control signal CS to the sigma-delta modulator 140.

The sigma-delta modulator 140 employs the noise transfer function to conduct a noise shaping process on the quantization noise. The process shifts the quantization noise to high frequency band to reduce the effect that the quantization noise brings about to the sigma-delta modulator 140, such that the signal quality of the output signal Dout can be enhanced.

Figure 3:
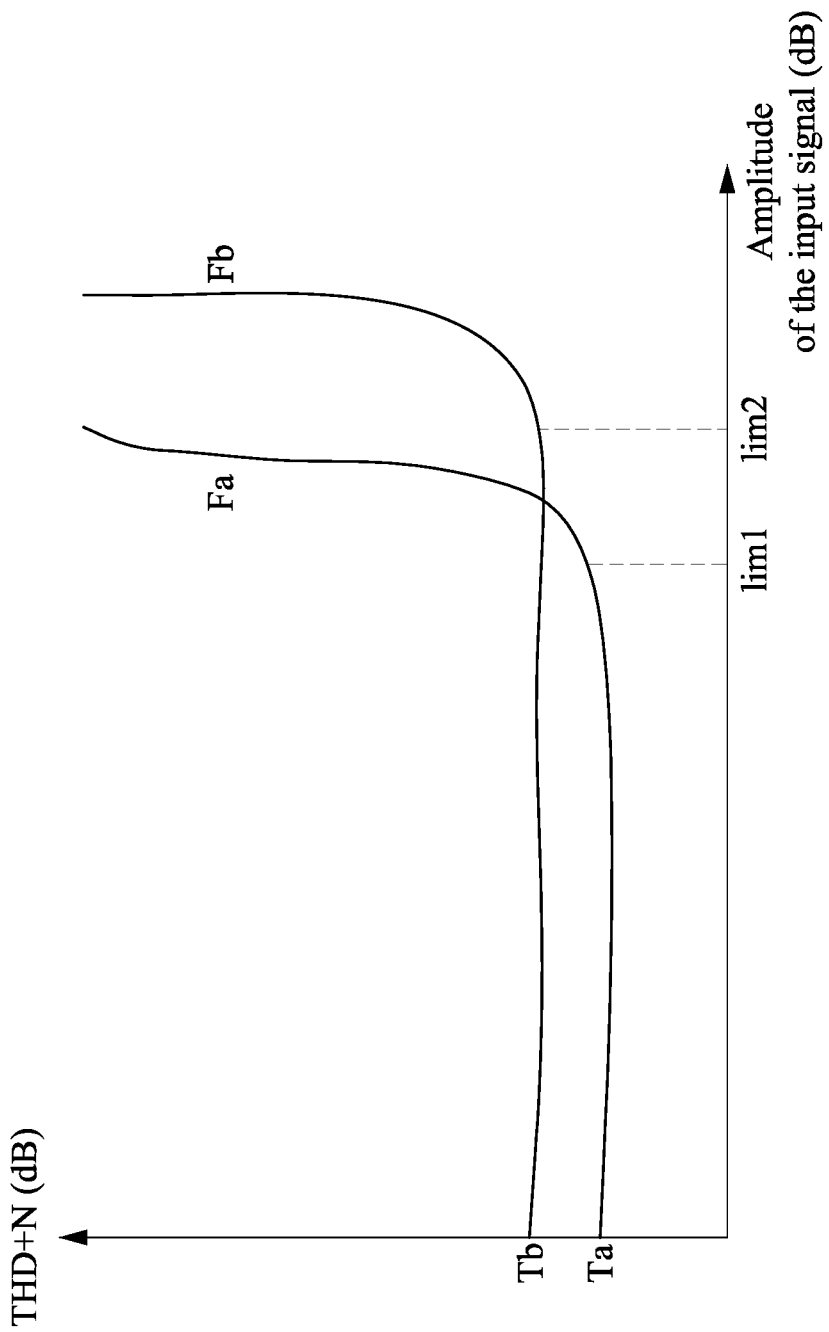
FIG. 3 is a schematic diagram showing the relationship between the THD+N of a plurality of noise transfer functions and the amplitude of the input signal according to some embodiments of this disclosure.

Further, the sigma-delta modulator 140 can store more than one noise transfer function with different functional mapping relationships. Reference is made to FIG. 3. FIG. 3 is the schematic diagram showing the relationship between the THD+N of a plurality of noise transfer functions, Fa and Fb, and the amplitude of the input signal according to one embodiment of this disclosure. In some embodiments, the sigma-delta modulator 140 stores these two different noise transfer functions Fa and Fb. However, these two different noise transfer functions Fa and Fb are for exemplary purpose and are not intended to limit the disclosure. In other words, in some other embodiments, the sigma-delta modulator 140 can store more than two noise transfer functions having different functional mapping relationships.

As shown in FIG. 3, the noise transfer function Fa corresponds to an input upper-bound lim1. When the amplitude of the input signal is smaller than lim1, the THD+N value of the noise transfer function Fa can be kept around Ta (hereinafter referred to as the stable THD+N value of the noise transfer function Fa). On the other hand, the noise transfer function Fb corresponds to another input upper-bound lim2. When the amplitude of the input signal is smaller than lim2, the THD+N value of the noise transfer function Fb can be kept (hereinafter referred to as the stable THD+N value of the noise transfer function Fb). The input upper-bound lim1 of the noise transfer function Fa is smaller than the input upper-bound lim2 of the noise transfer function Fb, and the stable THD+N value of the noise transfer function Fa is smaller than the stable THD+N value of the noise transfer function Fb. In other words, the noise transfer function Fa has better THD+N performance (i.e., lower THD+N) but a lower input upper-bound lim1. Generally, there is a positive correlation between the intensity of the input signal and output signal of the sigma-delta modulator 140. A stronger input signal of the sigma-delta modulator 140 can generate a stronger output signal accordingly. Therefore, if the sigma-delta modulator 140 adopts the noise transfer function Fa having the lower input upper-bound lim1, the maximum effective output signal of the sigma-delta modulator 140 can be decreased, and create a narrower dynamic range for the sigma-delta modulator 140.

On the other hand, the noise transfer function Fb has relatively worse THD+N performance (i.e., higher THD+N) but a higher input upper-bound lim1. Therefore, if the sigma-delta modulator 140 adopts the noise transfer function Fb having the higher input upper-bound lim2, the maximum effective output signal of the sigma-delta modulator 140 can be increased, and create wider dynamic range for the sigma-delta modulator 140.

In this embodiment, the amplitude threshold TH can be set to a value lower than or equal to the input upper-bound lim1 of the noise transfer function Fa, but this disclosure is not limited to it. In this case, when the amplitude of the detection signal DS generated according to the input signal Din is not larger than the amplitude threshold TH, the comparison circuit 122 generates a first control signal, and the sigma-delta modulator 140 can select the noise transfer function Fa according to the first control signal to reach better (i.e., smaller) THD+N Ta. On the contrary, when the amplitude of the detection signal DS is larger than the amplitude threshold TH, the comparison circuit 122 generates a second control signal, and the sigma-delta modulator 140 can select the noise transfer function Fb according to the second control signal to increase the amplitude limit of the input signal that the sigma-delta modulator 140 can process with (i.e., converting from the input upper-bound lim1 corresponding to the noise transfer function Fa to the input upper-bound lim2 corresponding to the noise transfer function Fb).

That is, when the amplitude of the detection signal DS is smaller than the input upper-bound lim1, the sigma-delta modulator 140 selects the noise transfer function Fa having smaller stable THD+N value (i.e., Ta); when the amplitude of the detection signal DS is larger than the input upper-bound lim1 (which will bring about gross distortion if the noise transfer function Fa is still being used), the sigma-delta modulator 140 selects the noise transfer functions Fb having relatively higher stable THD+N value (i.e., Tb) without distortion. In this way, because different noise transfer functions (e.g., Fa and Fb) correspond to different input upper-bounds (e.g., lim1 and lim2) and THD+N (e.g., Ta and Tb), the sigma-delta modulator 140 can, by switching between different noise transfer functions, dynamically select better dynamic range and maintain signal stability according to the amplitude of the input signal Din.

Figure 4:
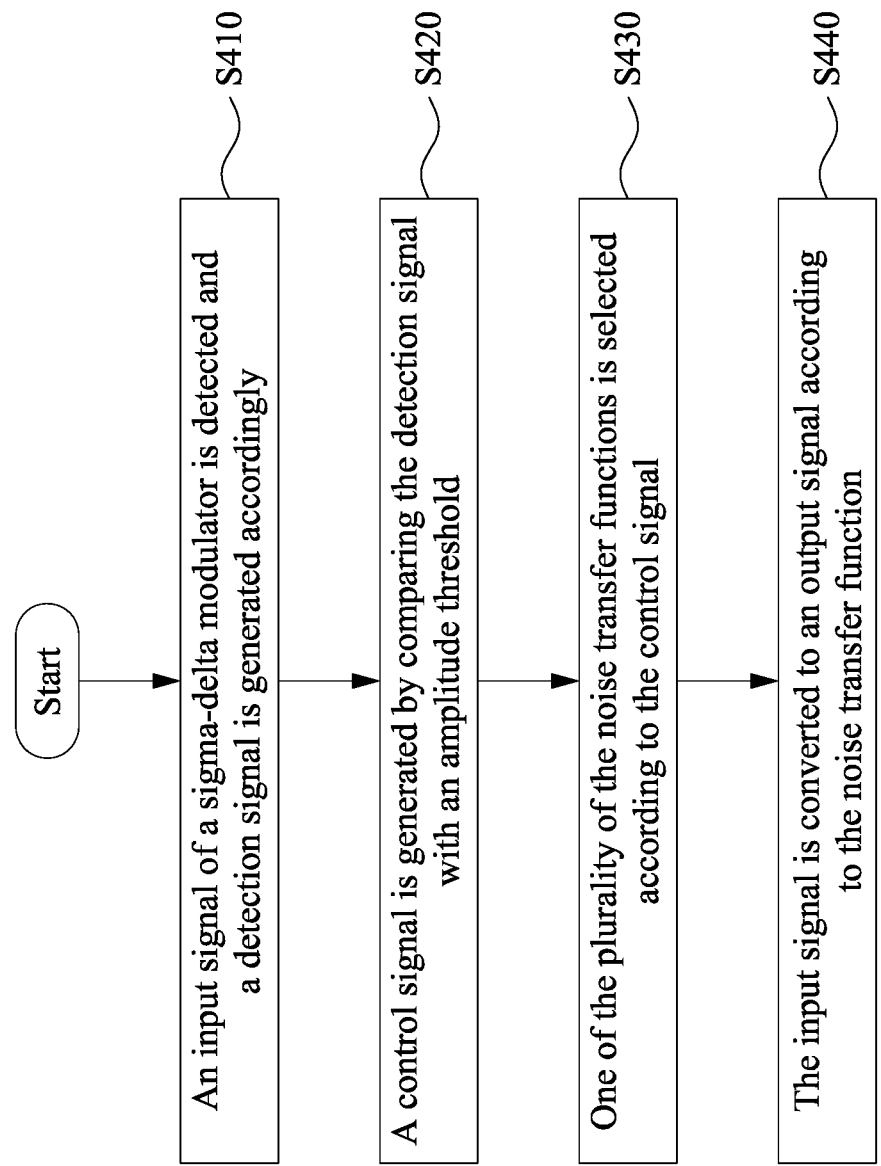
FIG. 4 is the flowchart of a method of interface connection according to some embodiments of this disclosure.

Reference is made to FIG. 4. FIG. 4 is the flowchart of a sigma-delta modulation method 400 according to one embodiment of this disclosure. Specifically, the sigma-delta modulation method 400 is applicable to the sigma-delta modulation device 100. For better understandings, the sigma-delta modulation method 400 is explained with reference, but not limited, to the embodiments of FIG. 2 and FIG. 3. Various modifications and variations can be made to the disclosure without departing from the scope or spirit of it by those skilled in the art. As shown in FIG. 4, the sigma-delta modulation method 400 includes operation S410, S420, S430, and S440.

In operation 410, an input signal Din of a sigma-delta modulator 140 is detected and a detection signal DS is generated accordingly. Specifically, an envelope detector 121 detects the amplitude variation of the input signal Din to generate the detection signal DS.

In operation S420, a control signal CS is generated by comparing the detection signal DS with an amplitude threshold TH. Specifically, the comparison circuit 122 compares the detection signal DS with the amplitude threshold TH. If it is determined that the amplitude of the detection signal DS is not larger than the amplitude threshold TH, the comparison circuit 122 generates a first control signal. On the contrary, if it is determined that the amplitude of the detection signal DS is larger than the amplitude threshold TH, the comparison circuit 122 generates a second control signal.

In operation S430, one of the plurality of the noise transfer functions Fa and Fb is selected according to the control signal CS. More specifically, the sigma-delta modulator 140 selects one of the noise transfer functions Fa and Fb that are stored in the sigma-delta modulator 140 according to the control signal generated by the comparison circuit 122. For example, the sigma-delta modulator 140 can select the noise transfer function Fa according to the first control signal and select the noise transfer function Fb according to the second control signal.

It is noted that, in other embodiments, the sigma-delta modulator 140 can adjust the parameters of the noise transfer functions stored therein according to the control signal generated by the comparison circuit 122 so that noise transfer functions with different performances can be switched to reach a balance between the input upper-bound and the THD+N.

In operation S440, the input signal Din is converted to an output signal Dout according to the noise transfer function. Specifically, the input signal Din can be converted to the output signal Dout according to the selected noise transfer function by the sigma-delta modulator 140 in operation S430.

In the foregoing embodiments, the noise transfer functions Fa and Fb are for exemplary purpose only. In other embodiments, if there are more noise transfer function candidates having different input upper-bounds and stable THD+N values, the sigma-delta modulator 140 can extend the dynamic range to a degree wider than the embodiment shown in FIG. 3 and further reduce the distortion probability.

It is understood that an aspect of the disclosure is to measure whether the input signal can cause the system unstable and dynamically provide a better noise transfer function accordingly. Though the aforementioned embodiments provide a preferred case by comparing the amplitude of input signal with specific threshold values directly, the disclosure is not limited to them. In some embodiments, other indicators (e.g., energy) of the input signal can be detected to achieve the same purpose.

Although the disclosed methods are shown and described herein as a series of steps or events, it is understood that the order of the illustrated steps or events is not strictly limited to the aforesaid order. For example, some steps may occur in a different order and/or concurrently with steps or events other than those shown and/or described herein. In addition, not all steps shown herein are necessary to implement one or more aspects or embodiments described herein. Further, one or more steps herein may also be performed in one or more separate steps and/or stages.

To sum up, by detecting the amplitude variation of the input signal Din, generating the corresponding control signal, and switching between different noise transfer functions (e.g., fa and Fb), the sigma-delta modulator 140 can maintain a great dynamic range and stability.

Although the present invention has been disclosed in the above embodiments, they are not intended to limit the disclosure. Those having ordinary knowledge in the art can make various modifications and retouches without departing from the spirit and scope of the present disclosure. Therefore, the protection scope of the disclosure is subject to the scope defined by the following claims.

What is claimed is:

1. A sigma-delta modulation device, comprising:
   a detection circuit configured to detect an input signal to generate a detection signal, and compare the detection signal with a threshold to generate a control signal; and
   a sigma-delta modulator coupled to the detection circuit and configured to store a plurality of noise transfer functions, select one of the noise transfer functions according to the control signal, and convert the input signal into an output signal according to the selected noise transfer function,
   wherein the plurality of noise transfer functions comprises a first noise transfer function and a second first noise transfer function, and
   wherein a first input upper-bound of the first noise transfer function is smaller than a second input upper-bound of the second noise transfer function, and a first total harmonic distortion plus noise of the first noise transfer function is smaller than a second total harmonic distortion plus noise of the second noise transfer function.

2. The sigma-delta modulation device of claim 1, wherein the detection circuit comprises:
   an envelope detector configured to receive the input signal and detect the amplitude variation of the input signal in order to generate the detection signal; and
   a comparison circuit configured to receive the detection signal and compare the detection signal with the threshold in order to generate the control signal.

3. The sigma-delta modulation device of claim 2, wherein the comparison circuit is configured to generate a first control signal in response to the detection signal being not larger than the threshold and generate a second control signal in response to the detection signal being larger than the threshold.

4. The sigma-delta modulation device of claim 3, wherein the sigma-delta modulator is configured to select the first noise transfer function according to the first control signal and select the second noise transfer function according to the second control signal.

5. The sigma-delta modulation device of claim 1, wherein the sigma-delta modulator selects the first noise transfer function in response to the detection signal being not larger than the threshold, the sigma-delta modulator selects the second noise transfer function in response to the detection signal being larger than the threshold.

6. A sigma-delta modulation method applicable to a sigma-delta modulation device comprising a sigma-delta modulator configured to store a plurality of noise transfer functions, wherein the sigma-delta modulation method comprises:
  detecting an input signal of the sigma-delta modulator to generate a detection signal;
  comparing the detection signal with a threshold to generate a control signal;
  selecting one of the noise transfer functions according to the control signal; and
  converting the input signal into an output signal according to the selected noise transfer function,
  wherein the plurality of noise transfer functions comprises a first noise transfer function and a second first noise transfer function, and
  wherein a first input upper-bound of the first noise transfer function is smaller than a second input upper-bound of the second noise transfer function, and a first total harmonic distortion plus noise of the first noise transfer function is smaller than a second total harmonic distortion plus noise of the second noise transfer function.

7. The sigma-delta modulation method of claim 6, wherein generating the detection signal comprises:
  detecting, by an envelope detector, an amplitude variation of the input signal to generate the detection signal.

8. The sigma-delta modulation method of claim 6, wherein generating the detection signal comprises:
  detecting, by an envelope detector, a duty cycle of the input signal to generate the detection signal.

9. The sigma-delta modulation method of claim 6, wherein generating the detection signal comprises:
  detecting, by an envelope detector, a time duration of a signal pulse of the input signal to generate the detection signal.

10. The sigma-delta modulation method of claim 6, wherein comparing the detection signal with the threshold to generate the control signal comprises:
  comparing, by a comparison circuit, the detection signal with the threshold;
  generating, by the comparison circuit, a first control signal in response to the detection signal being not larger than the threshold; and
  generating, by the comparison circuit, a second control signal in response to the detection signal being larger than the threshold.

11. The sigma-delta modulation method of claim 10, further comprising:
  selecting, by the sigma-delta modulator, the first noise transfer function according to the first control signal; and
  selecting, by the sigma-delta modulator, the second noise transfer function according to the second control signal.

12. The sigma-delta modulation method of claim 6, further comprising:
  selecting the first noise transfer function in response to the detection signal being not larger than the threshold; and
  selecting the second noise transfer function in response to the detection signal being larger than the threshold.

13. A sigma-delta modulation method applicable to a sigma-delta modulation device comprising a sigma-delta modulator configured to store a plurality of noise transfer functions, wherein the sigma-delta modulation method comprises:
  detecting an amplitude variation of an input signal of the sigma-delta modulator;
  comparing the amplitude variation with an amplitude threshold to generate a control signal;
  selecting one of the noise transfer functions according to the control signal; and
  converting the input signal into an output signal according to the selected noise transfer function,
  wherein the plurality of noise transfer functions comprises a first noise transfer function and a second first noise transfer function, and
  wherein a first input upper-bound of the first noise transfer function is smaller than a second input upper-bound of the second noise transfer function, and a first total harmonic distortion plus noise of the first noise transfer function is smaller than a second total harmonic distortion plus noise of the second noise transfer function.

14. The sigma-delta modulation method of claim 13, wherein comparing the amplitude variation with an amplitude threshold to generate the control signal comprises:
  comparing, by a comparison circuit, the detection signal with the threshold;
  generating, by a comparison circuit, a first control signal in response to the amplitude variation being not larger than the amplitude threshold; and
  generating, by a comparison circuit, a second control signal in response to the amplitude variation being larger than the amplitude threshold.

15. The sigma-delta modulation method of claim 14, further comprising:
  selecting, by the sigma-delta modulator, the first noise transfer function according to the first control signal; and
  selecting, by the sigma-delta modulator, the second noise transfer function according to the second control signal.

* * * * *